United States Patent [19]

Haidinger

[11] 4,413,409
[45] Nov. 8, 1983

[54] METHOD FOR ATTACHING AND FASTENING PARALLEL CURRENT LEAD WIRES TO OPPOSITE LATERAL SURFACES OF ELECTRICAL COMPONENTS

[75] Inventor: Erich Haidinger, Deutschlandsberg, Austria

[73] Assignee: Siemens Aktiengesellschaft, Berlin and Munich, Fed. Rep. of Germany

[21] Appl. No.: 271,828

[22] Filed: Jun. 9, 1981

[30] Foreign Application Priority Data

Jun. 16, 1980 [DE] Fed. Rep. of Germany ....... 3022590

[51] Int. Cl.³ ............................................. H01R 43/00
[52] U.S. Cl. ......................................... 29/856; 29/854
[58] Field of Search ................. 29/854, 856, 855, 412, 29/25.42, 621; 315/325, 36

[56] References Cited

U.S. PATENT DOCUMENTS

| 2,758,183 | 8/1956 | Canegallo | 29/412 X |
| 2,954,117 | 9/1960 | Freeburg | 29/854 X |
| 3,315,331 | 4/1967 | Weiss . | |
| 3,374,536 | 3/1968 | Schroeder et al. | 29/621 X |
| 3,586,903 | 6/1971 | Taterzynski | 315/36 X |

FOREIGN PATENT DOCUMENTS 2138083 3/1980 Fed. Rep. of Germany .

Primary Examiner—Howard N. Goldberg
Assistant Examiner—C. J. Arbes
Attorney, Agent, or Firm—Herbert L. Lerner; Laurence A. Greenberg

[57] ABSTRACT

Method for attaching and fastening parallel current lead wires to opposite lateral surfaces of an electrical component wherein current lead wires formed in one piece in the shape of a U are disposed in continuous sequence on a belt-shaped conveyor-carrier of an automatically operating assembly system so that part of the two legs of the U-shaped structure and the part of the U-shaped structure connecting the legs protrude laterally beyond the edge of the conveyor-carrier, and an electrical component is clamped between the two legs and soldered thereto, which includes the steps of:

(a) forming bends in the legs of U-shaped parallel current lead wires so as to adjust the mutual spacing of the legs in the part thereof projecting beyond the edge of the conveyor-carrier so that the spacing is smaller than is the length of the electrical component to be clamped between the legs, and the mutual spacing of the centers of the cross sections of the legs is greater than is the length of the electrical component, (b) inserting the electrical component between the legs in a direction perpendicular to the plane of the U-shaped structure and of the conveyor-carrier and spreading the legs apart due to the closer mutual spacing thereof than the length of the electrical component with resultant clamping of the electrical component between the legs, (c) soldering the component to the legs, (d) cutting off, in vicinity of the electrical component, the part of the U-shaped structure connecting the legs, and (e) testing the component with the current lead wires soldered thereto.

3 Claims, 3 Drawing Figures

METHOD FOR ATTACHING AND FASTENING PARALLEL CURRENT LEAD WIRES TO OPPOSITE LATERAL SURFACES OF ELECTRICAL COMPONENTS

The invention relates to a method for attaching and fastening parallel current lead wires to opposite lateral surfaces of electrical components by first providing a belt-shaped conveyor-carrier of an automatically operating assembly line or system continuously with one-piece U-shaped current lead wires which are intended for a respective component so that the two legs and the part of the U-shape connecting them project laterally beyond the edge of the conveyor-carrier, the component being then clamped between the legs and thereafter soldered to the legs.

Such a method has been described heretofore in German Published Prosecuted Application (DE-AS) 21 38 083, however, the electrical component is described therein as either being inserted perpendicularly to the plane of the U-shaped lead wires between the latter or, if bends are formed along the lead wires, leading to intersections of the lead wires, the components, though being inserted in the plane of the U-shaped lead wires, are nevertheless inserted in the direction of travel of the belt-shaped conveyor-carrier.

Whereas, when the components are inserted between the U-shaped lead wires perpendicularly to the plane thereof, a very accurate matching of or accommodation to the shape of the wire-like current leads of the component leads to failures in inserting, insertion in the direction parallel to the travel direction of the transport carrier requires additional measures of the automatically operating assembly line system when the intersecting parts of the lead wires are opened.

In German Published Prosecuted Application (DE-AS) 11 53 807, a method for attaching current leads to electrical components has been described heretofore, wherein the construction of the current leads and the attachment thereof to the belt-shaped carrier strip is effected in a manner that the protruding free ends ensure a clamping effect, the components are fastened between these free ends due to a clamping action, and the current leads are then fastened to the components electrically conductively and mechanically. The current leads intended for a component are of one-piece or integral construction, for example, hairpin-shaped.

This heretoforeknown method is suitable only for attaching and fastening current lead wires to electrical components which are disc-shaped, and in which the current lead wires are attached to opposite large lateral surfaces of the components.

In German Published Prosecuted Application (DE-AS) 11 62 011, a disc-shaped electrical impedance element and a method for attaching current lead wires to such an element have been described, wherein the current lead wires follow the outline of the disc, approach towards one another at a close spacing and are then bent away together from the edge of the disc, an insulating ring through which the wires are run, and in which these wires are anchored by part of a varnish layer enclosing the disc on all sides, being provided approximately at this location.

While, with this heretoforeknown method, the current lead wires are attached to the opposite narrow sides of a disc-shaped component, the method required for this type of attachment of current lead wires cannot be performed on automatically operating assembly lines or systems, wherein a belt-shaped conveyor-carrier is used.

In co-pending application U.S. Ser. No. 195,945 now U.S. Pat. No. 4,341,013 corresponding to German Application P 29 48 319.0 of Nov. 30, 1979, a method for attaching and fastening current lead wires to electrical components of the type described at the introduction hereto, in which the following method steps are provided:

(a) the part of the U-shaped parallel current lead wires extending laterally beyond the edge of the conveyor-carrier is bent away in the step following the insertion into the slots of the conveyor-carrier, into a part at an angle $\alpha$ of about 90°, forming a connecting bracket, in such a manner that the other part of the two wires remains in the previous plane thereof and, in this manner, permits insertion of the component in the direction of the current lead wires and in the plane of the conveyor-carrier;

(b) in the next succeeding step, the components are inserted between the current lead wires and are soldered to them in a conventional manner;

(c) in the next succeeding step, the connecting bracket is cut off in the vicinity of the component; and (d) subsequently, the components with the current lead wires are tested in a conventional manner, optionally encapsulated and finished.

In one preferred mode of this heretofore described method, a tapered insertion aid is formed by bends at the transition from the rectangularly bent-away part of the U-shape to the legs which have remained flat. Without this insertion aid, it is necessary to spread the current lead wires apart by means of a special tool to insert the components and, in this manner, ensure the clamping support or hold.

This heretofore known method has found acceptance particularly in the preferred mode thereof i.e. with insertion aids formed by bends, because the dimensions of the component, especially variations in the length thereof, are not critical. Yet, the rectangular bending-away is an additional operation which, however, is justified for these cases.

The term "electrical components" is used within the scope of the present invention for electrical resistors, for example, ceramic positive temperature-coefficient (PTC) conductors, electric capacitors, especially multi-layer capacitors with a ceramic dielectric, as well as generally such electric components which contain a body which either is itself part of the electric component (capacitors, resistors, semiconductors) or serves as a support plate for other electrical components (for example, multi-layer circuits), wherein a respective current lead wire is to be fastened to this support member at opposite sides.

When attaching and fastening current lead wires to electrical components by means of automatically operating assembly lines or systems, the individual operations or steps must be adjusted and matched to one another in such a manner that a short cycle time of the assembly line is made possible. The cycle time of the assembly line depends on the most time-consuming or most difficult operation or step.

While the forming of the individual lead wires of a component into U-shape, inserting the same into slots of a transport carrier belt, the further deformation of these lead wires, the later soldering thereof to the metal surfaces of the electrical component, the testing and encapsulating with a protective layer are operations or steps which can possibly be carried out rapidly by multiple subdivision, the insertion of the electrical component between the current lead wires and the temporary holding thereof up to the soldering operation or step presents difficulties, which lead to the situation that these operations or steps are determining for the overall cycle time of the assembly line.

To this is added the fact that the electrical components do not always have constant external dimensions, so that the insertion between the current lead wires for the temporary holding purpose presents difficulties, for example, in that the necessary temporary hold or support is not assured and, thereby, an electrically conducting and mechanically strong joint is not produced. If the electrical components which are to be provided with current lead wires have different dimensions due to the electrical requirements thereof, the assembly line or system must always be refitted, even if the differences are only small which, however, leads to shut-down periods, especially in the case of small quantities.

If, within a predetermined form of construction of the electrical components, such as a ceramic multi-layer capacitor, especially, there is achieved by the sequence of operations of this component, that practically no production-related variations occur, especially in the length L of the component, which is measured between the metal-coated opposite end faces, then it is unnecessary to form the 90° bend, spread apart with a special tool, or form an insertion aid as described in the hereinaforementioned prior-art method. In the case of parallel current leads which are connected for the manufacturing process by a U-bracket, it is necessary to spread them apart to effect a clamped hold or support of the component between the current lead wires. Spreading apart with a special tool of the automatic wiring machine, however, represents a separate operation or step which must be followed by the insertion of the component and the removal of the spreading-apart tool.

It is accordingly an object of the invention to provide a method of the foregoing type which can be performed automatically in a simple manner for the case wherein there are, for all practical purposes, no production-related variations, especially in the length of the component.

With the foregoing and other objects in view, there is provided, in accordance with the invention, a method for attaching and fastening parallel current lead wires to opposite lateral surfaces of an electrical component wherein current lead wires formed in one piece in the shape of a U are disposed in continuous sequence on a belt-shaped conveyor-carrier of an automatically operating assembly system so that part of the two legs of the U-shaped structure and the part of the U-shaped structure connecting the legs protrude laterally beyond the edge of the conveyor-carrier, and an electrical component is clamped between the two legs and soldered thereto which comprises the steps of:

(a) forming bends in the legs of U-shaped parallel current lead wire so as to adjust the mutual spacing of the legs in the part thereof projecting beyond the edge of the conveyor-carrier so that the spacing is smaller than is the length of the electrical component to be clamped between the legs, and the mutual spacing of the centers of the cross sections of the legs is greater than is the length of the electrical component, (b) inserting the electrical component between the legs in a direction perpendicular to the plane of the U-shaped structure and of the conveyor-carrier and spreading the legs apart due to the closer mutual spacing thereof than the length of the electrical component with resultant clamping of the electrical component between the legs, (c) soldering the component to the legs, (d) cutting off, in vicinity of the electrical component, the part of the U-shaped structure connecting the legs, and (e) testing the component with the current lead wires soldered thereto, optionally encapsulating and finishing it.

The method according to the invention ensures, through the particular selection of dimensions, that the component itself is used as the spreading tool, so that at least two additional operations or steps of the wiring process can be eliminated. The method has found acceptance in practice and is carried out with an automatically operating line or system, the individual stations of which are implemented with conventional devices and equipment elements.

Other features which are considered as characteristic for the invention are set forth in the appended claims.

Although the invention is illustrated and described herein as embodied in method for attaching and fastening parallel current lead wires to opposite lateral surfaces of electrical components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
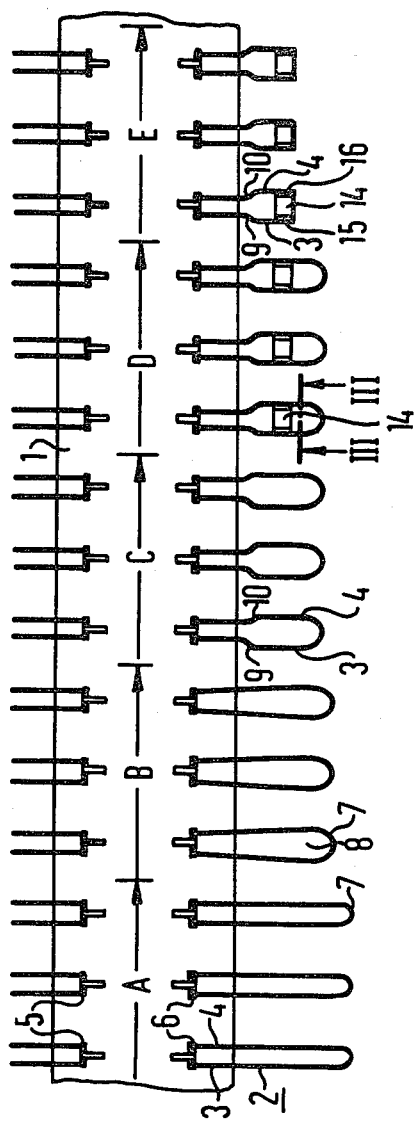
FIG. 1 is a fragmentary diagrammatic top plan view of a belt-shaped conveyor carrier, wherein the individual method steps of the invention are indicated, however, in a markedly brief form because, in a practical embodiment, a multiplicity of identically shaped current lead wires are entailed in each operation whereas, in FIG. 1 only a few such units are represented.

Referring now to the drawing and first, more particularly, to FIG. 1 thereof, there is shown a belt-shaped carrier strip 1. U-shaped parallel current lead wires 3 and 4 intended for an electrical component are inserted into slots 5 and 6 formed in the carrier strip 1. A part 2 of the U-shaped parallel current lead wires 3 and 4 extends beyond the edge of the conveyor carrier 1. The introduction of this one-piece U-section into the automatically operating installation is effected in a conventional manner, and more specifically, in accordance with the operating cycle of the assembly line, includes drawing from a supply reel, cutting it off to the required length, and inserting the cut wire into the slots 5 and 6 by means of a non-illustrated tongue or blade acting in the plane of the conveyor-carrier 1 and perpendicularly to the travel direction thereof.

Such devices are described, for example, in U.S. Pat. Nos. 2,953,840 and 3,315,331.

In the further course of the steps of the method, the part 2 which projects laterally beyond the edge of the conveyor-carrier 1, is bent into the form of a loop, the radius of the U-bend 7 becoming enlarged and the current lead wire 3 and 4 forming an angle therebetween opening away from the conveyor belt 1.

Then, the loop 8, in the vicinity of the edge of the conveyor-carrier 1, is provided with bends 9 and 10 which, on the one hand, serve to limit varnish coverings of the component along the wires, and, on the other hand, are concerned with maintaining the grid dimensions of the current lead wires 3 and 4. The bends 9 and 10 are dimensioned so that the current lead wires 3 and 4 again extend parallel to one another and merge into the U-bracket but at a greater distance from one another than in the pretruding part 2. The spacing A' (FIG. 3) of the current lead wires 3 and 4 from one another is smaller than is the length L of the component 14, as measured between the faces of the ends of the component 14 which have been provided with metal layers 15 and 16. The spacing C' between cross-section centers of the current lead wires 3 and 4 is greater than is the length L of the component 14. Due to this dimensioning, the component 14 itself can spread the current lead wires 3 and 4 apart, and indeed to an extent sufficient for providing a clamping hold.

Processing of the part of the mutually connected U-shaped current lead wires 3 and 4 projecting beyond the edge of the conveyor-carrier 1 is effected in operating steps A, B and C according to FIG. 1.

Figure 3:
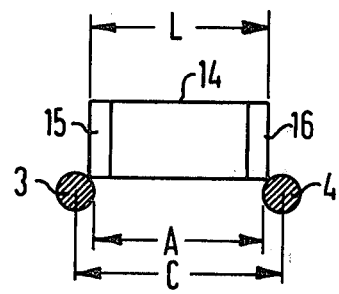
FIG. 3 is an enlarged cross-sectional view of FIG. 1 taken along the line III—III in direction of the arrows in which the dimensional relationships are apparent.

In operation or step D, the component 14 is inserted in a manner described in connection with FIG. 3.

Figure 2:
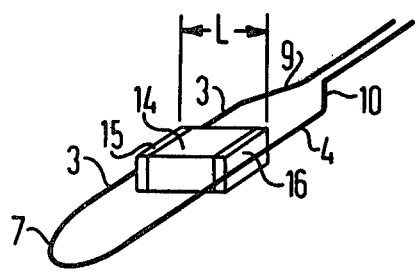
FIG. 2 is a fragmentary enlarged perspective view of FIG. 1 showing an individual component with current lead wires during the step or phase D.

FIG. 2 shows a component 14 formed with the surface metallizations 15 and 16 and held clamped between the current leads 3 and 4. The current lead wires 3 and 4 are mutually connected by the U-shaped band 7 and merge, at transitions provided by the bends 9 and 10, into parallel-extending parts which are stuck into the conveyor-carrier 1.

Soldering of the metallic current lead coatings 15 and 16 of the component 14 to the current lead wires 3 and 4 also is performed in operation or step D, and, indeed, preferably by conventional surge soldering in which a jet of solder is drawn from a liquid solder bath, is fed past the parts to be soldered and then returns into the solder bath.

In the next succeeding step or operation E, the connecting U-bends 7 together with parts of the current lead wires 3 and 4 are severed in the vicinity of the component 14, so that there is no longer any electrical connection between the metal current lead coatings 15 and 16 (which serve as solder contacts). The electrical components 14 are then tested in a conventional manner as to the electrical values or parameters thereof, are encapsulated if desired or necessary, and otherwise finished, for example, packaged.

By means of the invention of the instant application, the problem which inspired the conception thereof is solved in a fully satisfactory manner; in particular, the cycle time of the automatic system can be increased so that the automatically operating assembly line can now be operated at a cycle speed of 60 cycles per minute and more.

It is obvious that the individual operations or steps, such as inserting the current lead wires 3 and 4 into the slots 5 and 6 of the conveyor-carrier 1, forming the loop 8, producing the bends 9 and 10, inserting the components 14, soldering the components 14 to the current lead wires 3 and 4, as well as subsequent operations or steps, respectively, occur simultaneously, while the aforedescribed sequence is performed only during the starting phase of the assembly line.

There are claimed:

1. Method for attaching and fastening parallel current lead wires to opposite lateral surfaces of an electrical component wherein current lead wires formed in one piece in the shape of a U are disposed in continuous sequence on a horizontally disposed bent-shaped conveyor-carrier of an automatically operating assembly system so that part of the two legs of the U-shaped structure and the part of the U-shaped structure connecting the legs protrude laterally beyond the edge of the conveyor-carrier, and an electrical component is clamped between the two legs and soldered thereto, which comprises sequentially the steps of:

(a) forming bends in the legs of U-shaped parallel current lead wires so as to adjust the mutual spacing of the legs in the part thereof projecting beyond the edge of the conveyor-carrier so that the spacing is smaller than is the length of the electrical component to be clamped between the legs, and the mutual spacing of the centers of the cross sections of the legs is greater than is the length of the electrical component, (b) inserting the electrical component between the legs wherein said two legs each supports at least some vertically directed weight of said electrical component, in a direction perpendicular to the plane of the U-shaped structure and of the conveyor-carrier and spreading the legs apart due to the closer mutual spacing thereof than the length of the electrical component with resultant clamping of the electrical component between the legs, (c) soldering the component to the legs, (d) cutting off, in vicinity of the electrical component, the part of the U-shaped structure connecting the legs as well as the legs of the U-shaped structure, respectively, connected thereto, and (e) testing the component with the current lead wires soldered thereto.

2. Method according to claim 1 including encapsulating the component and at least part of the current lead wires.

3. Method according to claim 1 including packaging the component with the current lead wires.

* * * * *